(12) United States Patent
Wang et al.

(10) Patent No.: US 12,224,089 B2
(45) Date of Patent: Feb. 11, 2025

(54) THIN FILM RESISTOR

(71) Applicant: GLOBALFOUNDRIES Singapore Pte. Ltd., Singapore (SG)

(72) Inventors: Chuan Wang, Singapore (SG); Chim Seng Seet, Singapore (SG); Yudi Setiawan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 399 days.

(21) Appl. No.: 17/716,276

(22) Filed: Apr. 8, 2022

(65) Prior Publication Data

US 2023/0326634 A1     Oct. 12, 2023

(51) Int. Cl.
| | | |
|---|---|---|
| H01C 7/00 | (2006.01) | |
| H01C 17/08 | (2006.01) | |
| H01L 21/768 | (2006.01) | |
| H01L 23/522 | (2006.01) | |
| H01L 23/528 | (2006.01) | |

(52) U.S. Cl.
CPC ............ *H01C 7/006* (2013.01); *H01C 17/08* (2013.01); *H01L 21/76802* (2013.01); *H01L 23/5228* (2013.01); *H01L 23/5283* (2013.01)

(58) Field of Classification Search
CPC . H01C 7/006; H01C 7/00; H01C 7/12; H01C 7/08; H01C 7/06; H01C 17/08; H01C 17/075; H01C 17/12; H01C 17/006; H01L 21/76802; H01L 21/768; H01L 21/0254; H01L 21/76843; H01L 21/76816; H01L 23/5228; H01L 23/522; H01L 23/5283; H01L 23/528; H01L 28/24; H01L 28/20; H01L 28/91; H01L 28/60

See application file for complete search history.

(56) References Cited

U.S. PATENT DOCUMENTS

| | | | |
|---|---|---|---|
| 8,080,461 B2 | 12/2011 | Yeh et al. | |
| 11,552,011 B2 * | 1/2023 | Leng | H01L 28/91 |
| 2012/0152896 A1 | 6/2012 | Zhou et al. | |
| 2013/0234292 A1 | 9/2013 | Wei et al. | |
| 2015/0162396 A1 | 6/2015 | Yagi et al. | |
| 2022/0302018 A1 * | 9/2022 | Leng | H01L 28/20 |

FOREIGN PATENT DOCUMENTS

| | | |
|---|---|---|
| DE | 112019003036 | 3/2023 |
| WO | 2019/241094 | 12/2019 |

OTHER PUBLICATIONS

Stoppel et al., "NiCr resistors for terahertz applications in an InP DHBT process", Microelectronic Engineering, Mar. 1, 2019, Abstract, 3 pages.

(Continued)

*Primary Examiner* — Nikolay K Yushin

(74) *Attorney, Agent, or Firm* — Anthony Canale; Andrew M. Calderon; Calderon Safran & Wright P.C.

(57) ABSTRACT

The present disclosure relates to semiconductor structures and, more particularly, to a thin film resistor and methods of manufacture. A structure includes: a thin film resistor having an opening and being between an upper insulator material and a lower insulator material; and a contact extending through the opening in the thin film resistor and into the lower insulator material.

19 Claims, 4 Drawing Sheets

(56) References Cited

OTHER PUBLICATIONS

Linn et al., "Optimizing Contact Resistance at a Resistor/Conductor Interface via Thin Film Microanalysis and Process Design of Experiments", ISTFA, Oct. 1, 1999, Abstract, 2 pages.
German Office Action dated Feb. 23, 2024 in German Application No. 10 2023 104 793.0, 10 pages.
Google Machine Translation of German Office Action dated Feb. 23, 2024 in German Application No. 10 2023 104 793.0, 10 pages.

* cited by examiner

THIN FILM RESISTOR

BACKGROUND

The present disclosure relates to semiconductor structures and, more particularly, to a thin film resistor and methods of manufacture.

Resistors are an electrical component used in electrical circuits. In operation, the resistor provides an electrical resistance into the electrical circuit by restricting the amount of current flowing through the circuit.

Resistors may use thick film materials or thin film materials. The thin film resistor uses a thin resistive layer on top of an insulator material. The resistive layer may be a metallic layer deposited onto an underlying insulator substrate. An ohmic contact is formed to the metallic layer using conventional photolithography, etching and deposition processes; however, due to process variations in the etching process, as the device scales downward it becomes exceedingly difficult to obtain a low resistance contact. Also, conventional structures typically exhibit high contact resistance due to the ohmic contact layout between the contact and the metallic layer of the thin film resistor. The process variations and increased contact resistance become more pronounced as the thin film resistor scales downward.

SUMMARY

In an aspect of the disclosure, a structure comprises: a thin film resistor comprising an opening and being between an upper insulator material and a lower insulator material; and a contact extending through the opening in the thin film resistor and into the lower insulator material.

In an aspect of the disclosure, a structure comprises: a lower insulator material comprising a gouge; a thin film resistor comprising an opening aligned with the gouge of the lower insulator material; an upper insulator material comprising an opening aligned with the gouge of the lower insulator material and the opening of the thin film resistor; and a contact extending through the openings of the thin film resistor and the upper insulator material and the gouge of the lower insulator material, the contact physically contacting ends of the thin film resistor within the opening of the thin film resistor.

In an aspect of the disclosure, a method comprises: forming a thin film resistor on a lower insulator material; forming an upper insulator material on the thin film resistor; forming a trench into the upper insulator material, through the thin film resistor and into the lower insulator material below the thin film resistor; and forming a barrier liner on sidewalls of the trench, with the barrier liner contacting an upper surface of the thin film resistor and ends of the thin film resistor.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a thin film resistor and methods of manufacture. More specifically, the present disclosure provides a thin film resistor with a reduced contact resistance and methods of manufacture. In embodiments, the contact resistance of the thin film resistor (e.g., thin resistive layer) may be reduced compared to a traditional ohmic contact by forming a deep gouging (e.g., punch through) through the thin film resistor and into the underlying insulator material. Advantageously, the present disclosure provides a reduction in contact resistance that may otherwise by attributable to a scaling effect (e.g., process variations) and further provides an improvement in manufacturing yields.

The thin film resistor of the present disclosure can be manufactured in a number of ways using a number of different tools. In general, though, the methodologies and tools are used to form structures with dimensions in the micrometer and nanometer scale. The methodologies, i.e., technologies, employed to manufacture the thin film resistor of the present disclosure have been adopted from integrated circuit (IC) technology. For example, the structures are built on wafers and are realized in films of material patterned by photolithographic processes on the top of a wafer. In particular, the fabrication of the thin film resistor uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
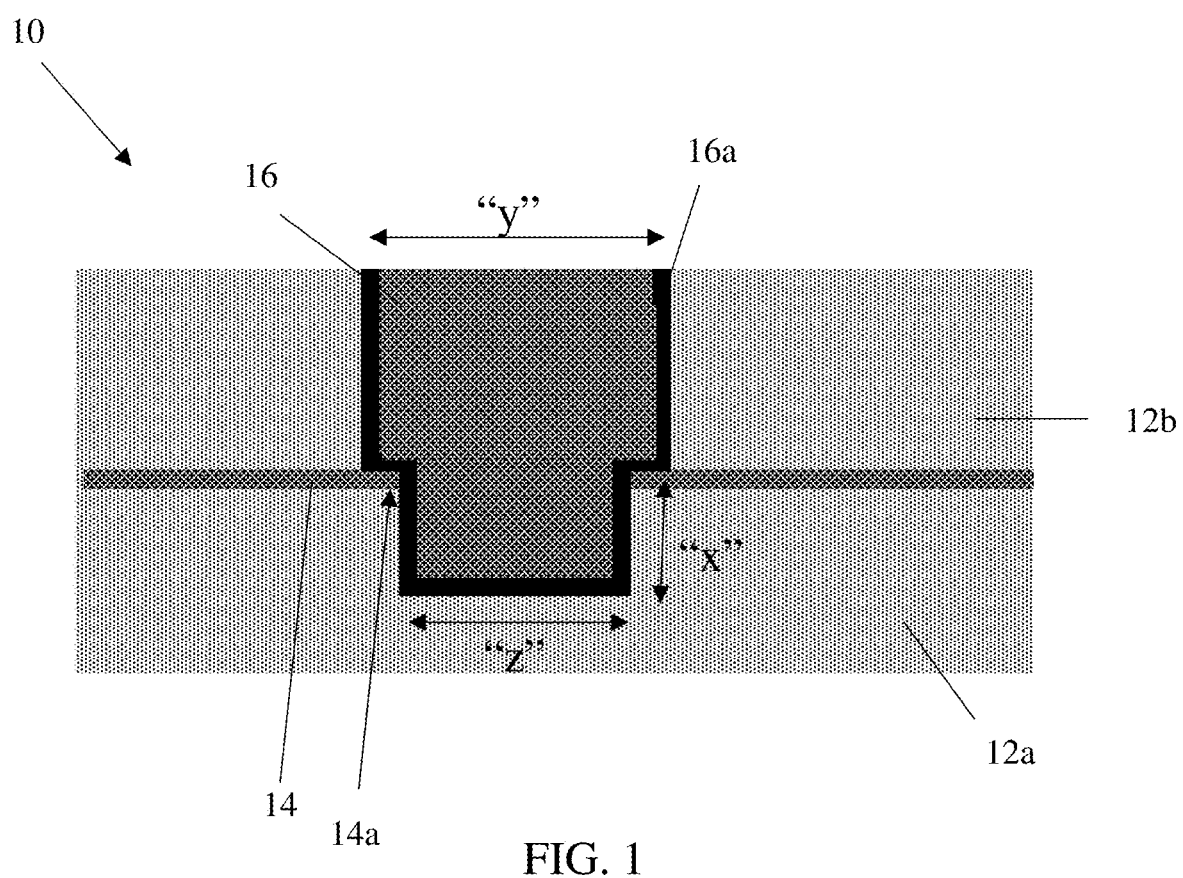
FIG. 1 shows a thin film resistor and respective fabrication processes in accordance with aspects of the present disclosure.

FIG. 1 shows a thin film resistor and respective fabrication processes in accordance with aspects of the present disclosure. In embodiments, the structure 10 includes a thin film resistor 14 between insulator materials 12a, 12b. In embodiments, the thin film resistor 14 may be SiCr; although other thin resistive materials are contemplated herein. The insulator materials 12a, 12b may be interlevel dielectric material, e.g., $SiO_2$. The thin film resistor 14 may be deposited by a plasma enhanced vapor deposition process, e.g., PEVD, whereas the insulator material 12a, 12b may be deposited by a chemical vapor deposition (CVD) process, as illustrative non-limiting examples.

A contact 16 comprising a barrier liner 16a may physically contact the thin film resistor 14 and extend into the underlying insulator material 12a. By way of non-limiting example, the contact 16 may be copper and the barrier liner 16a may be TaN, TiN or TaN/Ta. In alternative embodiments, the contact 16 and barrier liner 16a may be any appropriate back end of the line (BEOL) materials. It is noted, though, the use of copper is preferable as this material exhibits low resistance properties.

In embodiments, the contact 16 extends below the thin film resistor 14 and into the underlying insulator material 12a resulting in a "riveting" contact. For example, in embodiments, the upper portion of the contact 16 (e.g., barrier liner 16a) will rest on and physically contact a top surface of the thin film resistor 14 and will have a larger cross-sectional area "y" (e.g., overhang) than a cross-sectional area "z" of a lower portion of the contact which is below the thin film resistor 14. In addition, in embodiments, a sidewall of the contact 16 (e.g., barrier liner 16a) will physically contact end portions 14a of the thin film resistor 14. This layout ensures that regardless of the scaling of the device and process variations particularly with etching processes, only a small portion of the contact 16 (e.g., at the overhang and sidewall below the overhang) will contact the thin film resistor 14 thus resulting in a low resistance contact being provided (compared to an ohmic contact of conventional structures).

In embodiments, the insulator material 12a may be deposited to a thickness of about fifty times the thickness of the thin film resistor 14. For example, the thin film resistor 14 may be deposited to a thickness of about 25 Å to 30 Å and the insulator material 12a may be deposited to a thickness of, for example, about 125 nm to about 150 nm. In further embodiments, the minimum depth "x" of the contact 16 into the insulator material 12a may be about twenty times the thickness of the thin film resistor 14. For example, the depth "x" may be about 50 to 60 nm below the thin film resistor 14. In further examples, the depth "x" of the contact 16 may be about a minimum of 40% and a maximum of 70% of the thickness of the insulator material 12a. The depth "x," e.g., deep gouging, can be obtained by adjusting the etching properties as described in more detail with respect to FIGS. 2A-2D.

It should also be recognized that by having the dimensions provided herein, e.g., depth "x," scaling effects due to process variations may be significantly reduced resulting in a consistent lower contact resistance between the thin film resistor 14 (e.g., SiCr) and the contact 16, e.g., top metal. For example, the depth "x," e.g., deep gouging of the underlying insulator material 12a, ensures a punch through effect and prevents traditional ohmic contact which has a significantly higher resistance than the "riveting" contact provided in the present disclosure.

Figure 2A:
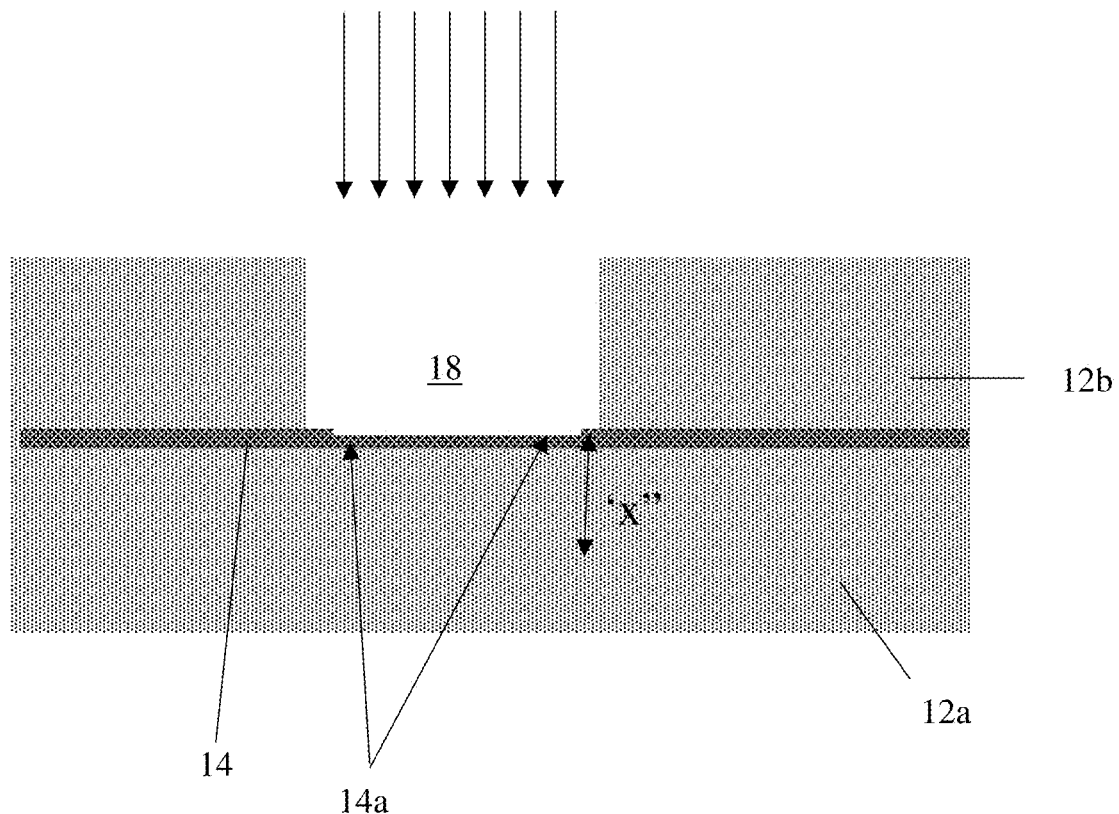
FIGS. 2A-2D representatively show a deep gouging or etching process in accordance with aspects of the present disclosure.

FIGS. 2A-2D representatively show a deep gouging or etching process in accordance with aspects of the present disclosure. As shown in FIG. 2A, in embodiments, a trench (e.g., opening) 18 is provided through the insulator material 12b and stops at the thin film resistor 14. In embodiments, the trench 18 is formed using lithography and etching processes as described herein. By way of example of the lithography and etching processes, a resist formed over the insulator material 12b is exposed to energy (light) and developed utilizing a conventional resist developer to form a pattern (opening). An etching process with a selective chemistry, e.g., reactive ion etching (RIE), will be used to transfer the pattern from the patterned resist layer into the underlying insulator material 12b, stopping on the thin film resistor 14. In embodiments, etching can be stopped at the thin film resistor 14 as determined by a signal received when the etchant reaches the thin film resistor 14.

Figure 2B:
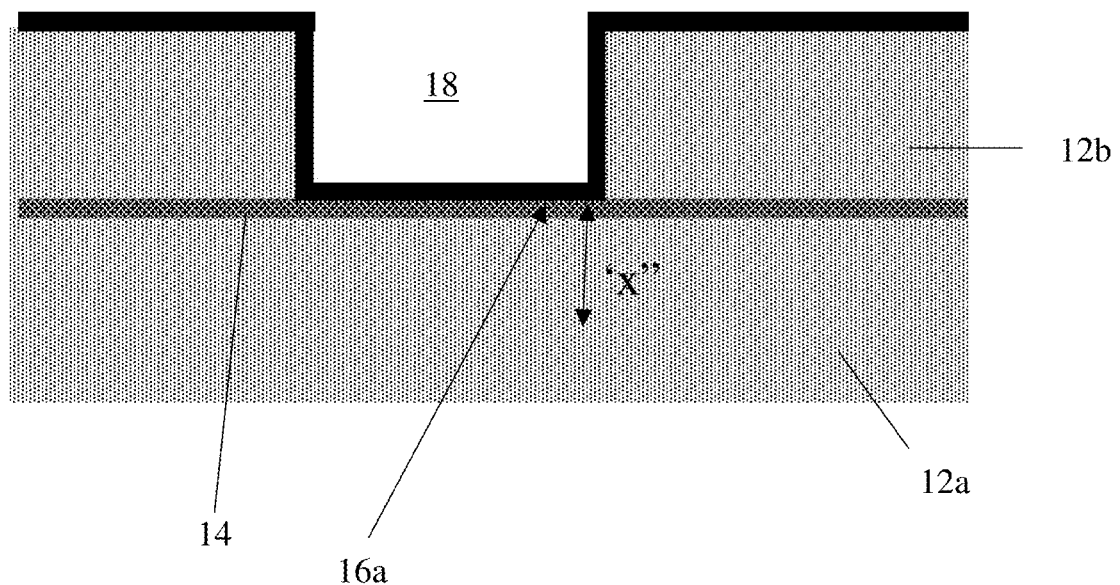

In FIG. 2B, the barrier liner 16a is deposited within the trench 18, and more specifically on the sidewalls and a bottom surface of the trench 18. In embodiments, the barrier liner 16a may be deposited by a PEVD process on the sidewalls and a bottom surface of the trench 18. As shown, in FIG. 2B, the barrier liner 16a is deposited directly on the thin film resistor 14 at the bottom of the trench 18. The barrier liner 16a may be TaN/Ta as an example.

Figure 2C:
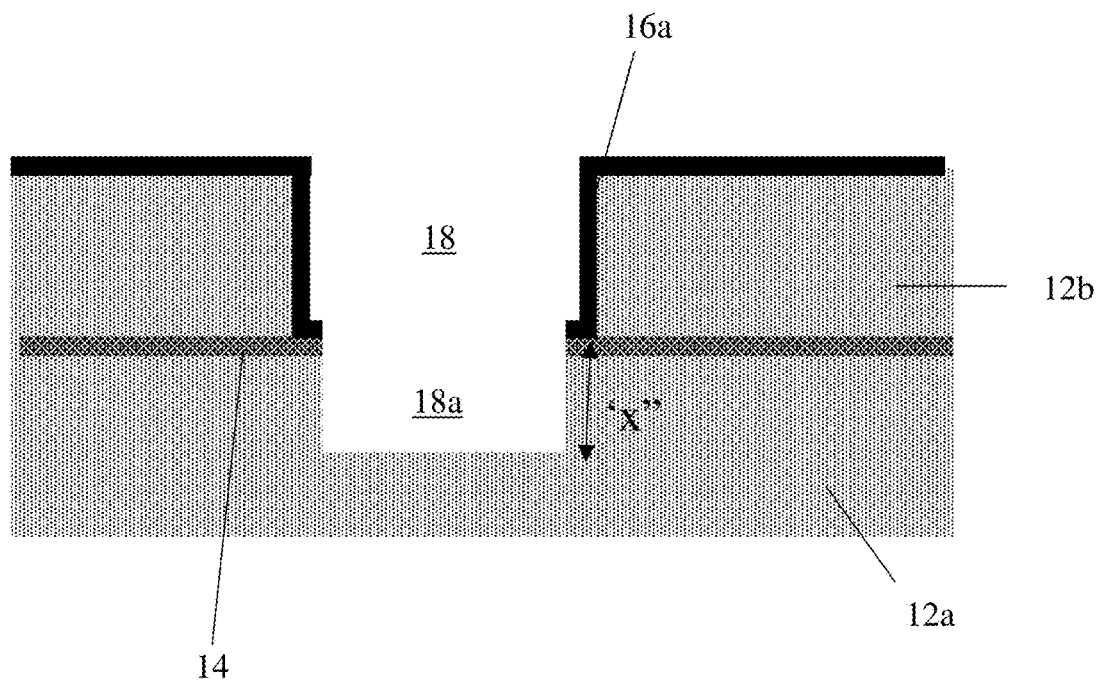

In FIG. 2C, the barrier liner 16a and thin film resistor 14 are etched back at the bottom of the trench 18 and a deep gouge 18a is formed in the insulator material 12a to a depth of "x". In embodiments, the deep gouge 18a is self-aligned with the trench 18. The etching process includes a deliberate over-etch into the insulator material 12a.

In embodiments, the over-etch process utilizes different parameters than conventional processes to ensure that the trench, e.g., deep gouge 18a, extends into the underlying insulator material 12a underneath the thin film resistor 14. In embodiments, the etching process is performed in-situ (without a vacuum break) in a barrier deposition chamber using, e.g., a Ta+ plasma with a bias to bombard the bottom of the trench for the etching process. As such, the etch back occurs at a bottom of the trench and a deposition of material, for example, occurs at the surface of the structure, e.g., on the already existing barrier liner 16a.

For example, during the etch process, DC power may be lowered to below, for example, 1 kW (compared to conventional processes that have increased power typically 1 kW to 6 kW). An additional parameter adjustment may be to increase the bias power to above 120V (e.g., about 500 W and typically 500-1000 W). Another adjustment may be to increase the etch time for an over-etch of the thin film resistor 14. The etch time will depend on the thickness of the thin film resistor 14, as an example, and it can be determined by a signal received when the etchant reaches to the underlying insulator material 12a. In addition, the RF coil power may be increased to about above 800 W and typically about 800-2000 W. In embodiments, any combination of these parameter adjustments may be used to provide the deliberate deep gouging effect. In embodiments, the etch back process may be performed in the liner deposition chamber (e.g., barrier liner 16a chamber) in-situ.

Figure 2D:
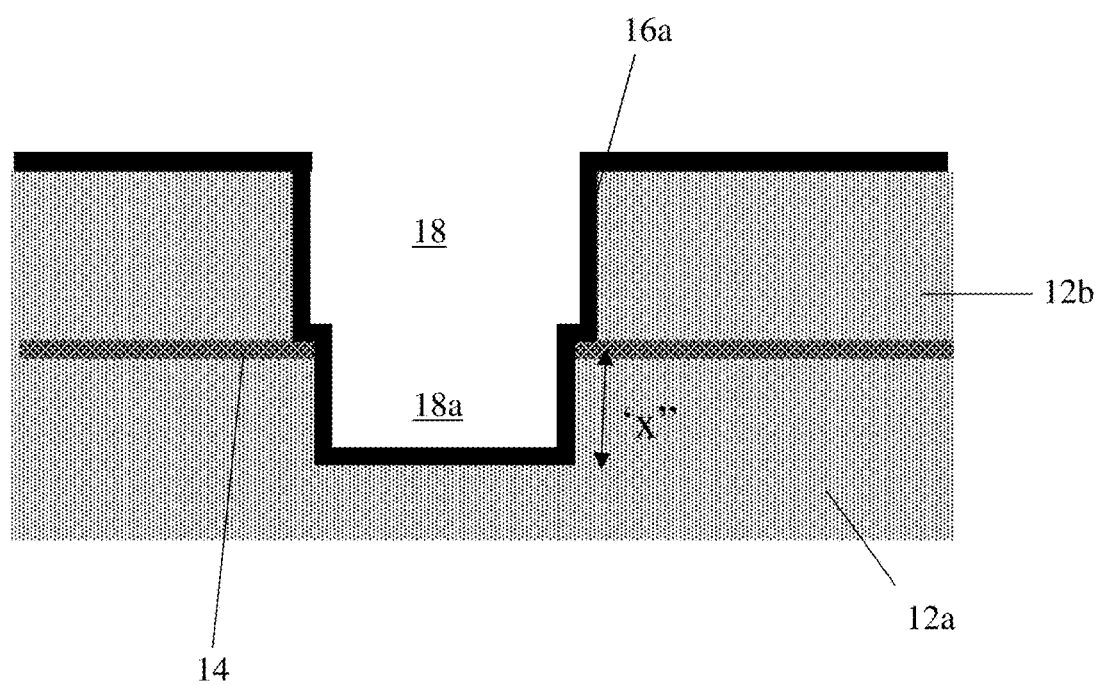

As shown in FIG. 2D, after the etch back process the barrier liner 16a can be redeposited in the trench 18a by conventional deposition processes, e.g., CVD. In embodiments, the deposition of the barrier liner 16a may be used to repair any damage to the liner caused by the etching process, in addition to lining the bottom and sidewalls of the deep gouge 18a.

Reverting again to FIG. 1, the contact 16 is then formed over the barrier liner 16a. In embodiments, the contact 16 may be copper deposited by an electrochemical plating (ECP) process within the deep gouge 18. In this way, the contact 16 and barrier liner 16a will extend into the insulator material 12a, and will be in physical contact with a small portion of the thin film resistor 14 at the overhang, e.g., junction between the larger cross-sectional area "y" and smaller cross-sectional area "z". This layout will result in a lower contact resistance as only a small portion of the contact 16 is physically connected to the thin film resistor 14.

Figure 3:
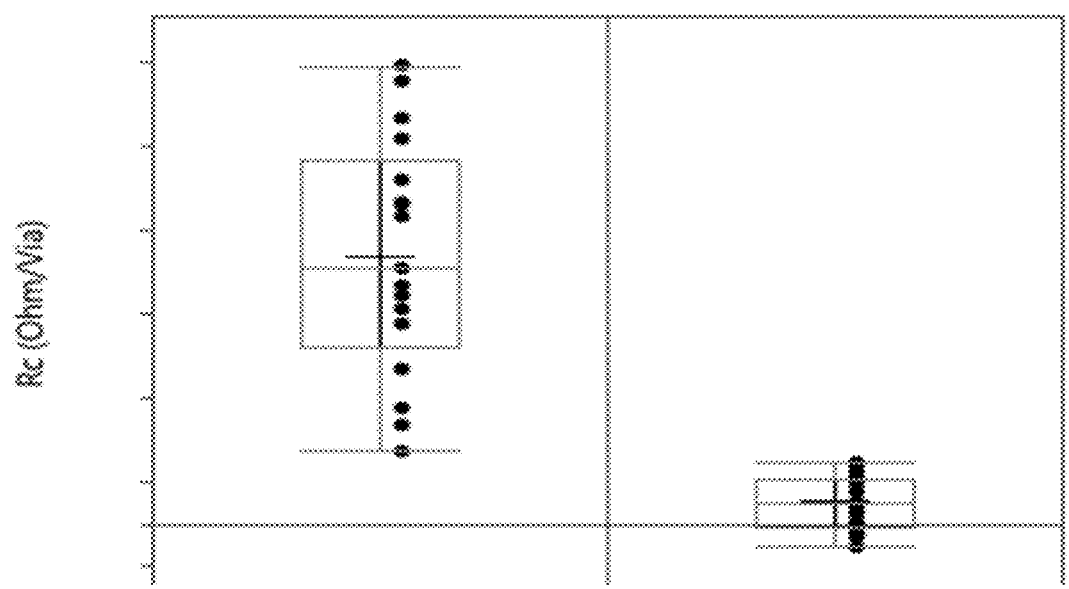
FIG. 3 shows a variability chart of contact resistance for a traditional structure (fabricated using conventional processes) and the thin film resistor fabricated with the processes as described in accordance with aspects of the present disclosure.

FIG. 3 shows a variability chart of contact resistance for traditional thin film resistor structures (fabricated using conventional methods) and the thin film resistor structures fabricated with the processes as described herein. As shown in the chart, side "A" shows thin film resistor structures fabricated in a conventional manner and side "B" shows thin film resistor structures fabricated in accordance with the processes described herein.

First, it is noteworthy that the structures shown on side "A" have a significantly greater variability in resistance than the structures on side "B" fabricated in accordance with the processes described herein. This may be due to process variabilities of conventional fabrication processes, particularly being pronounced as the devices scale downward. Second, not only do the structures on side "B" show less variability, they also importantly exhibit consistently lower contact resistance. Accordingly, by having less contact resistance variability, the yield can be improved while improving, e.g., reducing, contact resistance.

The thin film resistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a thin film resistor comprising an opening and being between an upper insulator material and a lower insulator material; and
a contact extending through the opening in the thin film resistor and into the lower insulator material, wherein a sidewall of the contact physically contacts ends of the thin film resistor within the opening.

2. The structure of claim 1, wherein the thin film resistor comprises SiCr.

3. The structure of claim 1, wherein a minimum depth "x" of the contact into the lower insulator material is about 20 times a thickness of the thin film resistor.

4. The structure of claim 1, wherein a minimum depth of the contact extending into the lower insulator material is about 40% of a thickness of the lower insulator material.

5. The structure of claim 1, wherein a maximum depth of the contact extending into the lower insulator material is about 70% of a thickness of the lower insulator material.

6. The structure of claim 1, wherein the contact comprises an overhang on an upper surface of the thin film resistor.

7. The structure of claim 6, wherein the contact comprises a riveting layout.

8. The structure of claim 7, wherein the contact comprises an upper-cross sectional area larger than a lower cross-sectional area, a junction between the upper cross-sectional area and the lower cross-sectional area comprises the overhang, and the lower cross-sectional area extends through the opening and into the lower insulator material.

9. A structure comprising:
a lower insulator material comprising a gouge;
a thin film resistor comprising an opening aligned with the gouge of the lower insulator material;
an upper insulator material comprising an opening aligned with the gouge of the lower insulator material and the opening of the thin film resistor; and
a contact extending through the openings of the thin film resistor and the upper insulator material and the gouge of the lower insulator material, the contact physically contacting ends of the thin film resistor within the opening of the thin film resistor.

10. The structure of claim 9, wherein the thin film resistor comprises SiCr.

11. The structure of claim 9, wherein the contact comprises a riveting layout.

12. The structure of claim 11, wherein the contact comprises an overhang on an upper surface of the thin film resistor.

13. The structure of claim 12, wherein the contact comprises an upper-cross sectional area larger than a lower cross-sectional area and a junction between the upper cross-sectional area and the lower cross-sectional area comprises the overhang.

14. The structure of claim 9, wherein the thin film resistor comprises a thickness of about 25 Å to 30 Å.

15. The structure of claim 14, wherein a minimum depth of the contact into the lower insulator material is about 20 times a thickness of the thin film resistor.

16. The structure of claim 14, wherein a thickness of the lower insulator material is about 50 times a thickness of the thin film resistor.

17. The structure of claim 16, wherein a minimum depth of the contact extending into the lower insulator material is about 40% of a thickness of the lower insulator material.

18. The structure of claim 16, wherein a maximum depth of the contact into the lower insulator material is about 70% of a thickness of the lower insulator material.

19. A method comprising:
forming a thin film resistor on a lower insulator material;
forming an upper insulator material on the thin film resistor;
forming a trench into the upper insulator material, through the thin film resistor and into the lower insulator material below the thin film resistor;
forming a barrier liner on sidewalls of the trench, with the barrier liner contacting an upper surface of the thin film resistor and ends of the thin film resistor.

* * * * *